US012672540B2

(12) United States Patent
Lam et al.

(10) Patent No.: US 12,672,540 B2
(45) Date of Patent: Jun. 30, 2026

(54) INTEGRATED CIRCUIT DEVICE

(71) Applicant: Microchip Technology Incorporated, Chandler, AZ (US)

(72) Inventors: Mankit Lam, Colorado Springs, CO (US); Julius Kovats, Manitou Springs, CO (US)

( * ) Notice: Subject to any disclaimer, the term of this patent is extended or adjusted under 35 U.S.C. 154(b) by 370 days.

(21) Appl. No.: 18/585,335

(22) Filed: Feb. 23, 2024

(65) Prior Publication Data

US 2025/0096060 A1 Mar. 20, 2025

Related U.S. Application Data

(60) Provisional application No. 63/539,346, filed on Sep. 20, 2023.

(51) Int. Cl.
*H10W 40/00* (2026.01)
*H10W 70/60* (2026.01)
(Continued)

(52) U.S. Cl.
CPC ......... *H10W 40/00* (2026.01); *H10W 70/614* (2026.01); *H10W 70/69* (2026.01);
(Continued)

(58) Field of Classification Search
None
See application file for complete search history.

(56) References Cited

U.S. PATENT DOCUMENTS

| | | | | | |
|---|---|---|---|---|---|
| 2008/0136004 | A1* | 6/2008 | Yang | ..................... | H10W 90/00 |
| | | | | | 438/109 |
| 2011/0298110 | A1* | 12/2011 | Pagaila | .............. | H10W 70/614 |
| | | | | | 257/E23.101 |
| 2015/0187710 | A1 | 7/2015 | Scanlan et al. | ............... | 257/777 |

FOREIGN PATENT DOCUMENTS

| | | | | |
|---|---|---|---|---|
| CN | 107104058 A | 8/2017 | ............. | H01L 21/60 |
| EP | 3772094 A2 | 2/2021 | ............. | H01L 21/56 |

OTHER PUBLICATIONS

International Search Report and Written Opinion, Application No. PCT/US2024/020629, 28 pages, Jul. 30, 2024.

(Continued)

*Primary Examiner* — Kyoung Lee
(74) *Attorney, Agent, or Firm* — SLAYDEN GRUBERT BEARD PLLC

(57) ABSTRACT

An integrated circuit (IC) device includes a die including a silicon region having a coefficient of thermal expansion ($CTE_{silicon}$), and a conductive contact on a first side of the first die. An encapsulant laterally adjacent the silicon region of the first die has a coefficient of thermal expansion ($CTE_{encapsulant}$), wherein a mismatch between the $CTE_{silicon}$ and the $CTE_{encapsulant}$ defines a thermal stress interface between the silicon region and the encapsulant. The IC device includes a dielectric layer formed over the first die and the encapsulant, and includes a dielectric spacer region extending over and laterally across the thermal stress interface. The IC device includes a redistribution layer (RDL) including an RDL element formed over the dielectric spacer region and electrically connected to the conductive contact through an opening in the dielectric layer, wherein the RDL element is physically spaced apart from the thermal stress interface by the dielectric spacer region.

21 Claims, 12 Drawing Sheets

300

(51) Int. Cl.
  *H10W 70/69*       (2026.01)
  *H10W 74/47*       (2026.01)
  *H10W 70/09*       (2026.01)
  *H10W 72/00*       (2026.01)
  *H10W 74/40*       (2026.01)
  *H10W 90/00*       (2026.01)
  *H10W 90/20*       (2026.01)

(52) U.S. Cl.
  CPC ............ *H10W 74/47* (2026.01); *H10W 70/09*
      (2026.01); *H10W 70/60* (2026.01); *H10W*
    *72/0198* (2026.01); *H10W 72/07227* (2026.01);
          *H10W 72/853* (2026.01); *H10W 74/40*
        (2026.01); *H10W 90/00* (2026.01); *H10W*
                    *90/288* (2026.01)

(56)                References Cited

OTHER PUBLICATIONS

Partial International Search Report and Written Opinion, Application No. PCT/US2024/020629, 21 pages, Jun. 6, 2024.

* cited by examiner

INTEGRATED CIRCUIT DEVICE

RELATED APPLICATION

This application claims priority to commonly owned U.S. Provisional Patent Application No. 63/539,346 filed Sep. 20, 2023, the entire contents of which are hereby incorporated by reference for all purposes.

TECHNICAL FIELD

The present disclosure relates to integrated circuit (IC) devices and methods of forming IC devices.

BACKGROUND

Wafer fabrication ("fab") technology has become increasingly complex, costly and time consuming to develop. Many IC devices, e.g., IC packages, are "multi-die" devices including multiple dies (also referred to as chips or chiplets) mounted in a common package. Some multi-die IC devices include multiple dies mounted to each other in a face-to-face arrangement, e.g., allowing communication of electrical signals between the dies.

For example, for certain microcontrollers including different type of dies (e.g., analog chiplets and digital chiplets that perform different functions of the microcontroller), it may be advantageous to manufacture the different dies separately (e.g., using different manufacturing technologies) and then mount the dies to each other in a face-to-face arrangement, rather than manufacturing the different dies together, e.g., on a common wafer or panel. Such microcontrollers (or other devices) that include multiple different type of dies may be referred to as heterogenous multi-die IC devices.

Techniques for mounting dies to each other in a face-to-face arrangement, e.g., using flip-chip solder bonding, are often limited or challenging. For example, processes for mounting ultra fine-pitch chiplets in a face-to-face manner often have limited precision and result in undesirable error rates. Equipment for such assembly processes is typically expensive, and bonding is typically done on a chip-by-chip basis (which may be time consuming in a panel-level packaging (PLP) process, for example), and typically requires many critical controls.

There is a need for improved IC devices, including multi-die devices, and improved methods of forming IC devices, for example multi-die packages formed using PLP processing.

SUMMARY

The present disclosure provides an IC device including at least one die having a silicon region and an adjacent encapsulant, wherein a mismatch between a CTE (coefficient of thermal expansion) of the silicon region and a CTE of the encapsulant defines a thermal stress interface between the silicon region and the encapsulant. The IC device may include a redistribution layer (RDL) element electrically connected to the die and extending laterally, e.g., outside a lateral footprint of the die. The device may include a dielectric spacer region extending over and laterally across the thermal stress interface, which dielectric spacer region physically separates the RDL element from the thermal stress interface, e.g., to reduce the effects of the thermal stress interface on the RDL element.

The present disclosure also provides multi-die IC devices including multiple dies (e.g., chips or "chiplets") mounted together face-to-face, and methods of forming such multi-die IC devices. Some examples provide die-level integration between two or more dies (e.g., an analog die and a digital die) using panel level (PLP) assembly technology. Some examples provide a multi-die device including a first die and a second die mounted in a face-to-face configuration. The first die and second die may be mounted to each other by solder bond connections. In addition, the device may include RDL elements connected directly (i.e., without solder bonds) to respective contacts (e.g., metal traces) formed on the first die, which RDL elements may extend laterally outside a lateral footprint of the first die (and in some examples outside a lateral footprint of the second die), e.g., to provide external connectivity to the multi-die device. In some examples, such RDL elements may provide the function of soldered wire bonds provided in certain conventional devices, and may provide one or more advantages relative to such soldered wire bonds, as discussed below.

One aspect provides an IC device including a die including a silicon region having a coefficient of thermal expansion ($CTE_{silicon}$), and a conductive contact on a first side of the first die. An encapsulant laterally adjacent the silicon region of the first die has a coefficient of thermal expansion ($CTE_{encapsulant}$), wherein a mismatch between the $CTE_{silicon}$ and the $CTE_{encapsulant}$ defines a thermal stress interface between the silicon region and the encapsulant. The IC device includes a dielectric layer formed over the first die and the encapsulant, and includes a dielectric spacer region extending over and laterally across the thermal stress interface. The IC device includes a redistribution layer (RDL) including an RDL element formed over the dielectric spacer region and electrically connected to the conductive contact through an opening in the dielectric layer, wherein the RDL element is physically spaced apart from the thermal stress interface by the dielectric spacer region.

In some examples, a coefficient of thermal expansion of the dielectric spacer region (CTEDSR) differs from the $CTE_{encapsulant}$ by less than 50% of the $CTE_{encapsulant}$. In some examples, the CTEDSR differs from the $CTE_{encapsulant}$ by less than 25% of the $CTE_{encapsulant}$.

In some examples, a CTE mismatch between the $CTE_{DSR}$ and the $CTE_{encapsulant}$ is less than 50% of a CTE mismatch between the $CTE_{silicon}$ and the $CTE_{encapsulant}$. In some examples, the CTE mismatch between the $CTE_{DSR}$ and the $CTE_{encapsulant}$ is less than 25% of the CTE mismatch between the $CTE_{silicon}$ and the $CTE_{encapsulant}$.

In some examples, the dielectric spacer region comprises a polymer.

In some examples, the dielectric spacer region comprises a polyimide.

In some examples, the IC device includes a through-mold via laterally spaced apart from the first die, wherein the RDL element is electrically connected to the through-mold via through a second opening in the dielectric layer.

In some examples, the IC device includes a second die mounted to the first die in a face-to-face arrangement.

In some examples, the IC device includes alignment structures formed over the dielectric layer, the alignment structures comprising a polymer, wherein a lateral alignment of the second die is constrained by the alignment structures.

In some examples, a footprint area of the second die differs from a footprint area of the first die by less than 25%.

In some examples, at least a portion of the RDL element is aligned directly between the first die and the second die.

One aspect provides a method of forming an integrated circuit (IC) device. A first die is mounted on a substrate, the first die including a silicon region having a coefficient of thermal expansion ($CTE_{silicon}$), and a conductive contact on a first side of the first die. An encapsulant is formed on the first die, the encapsulant having a coefficient of thermal expansion ($CTE_{encapsulant}$), wherein a mismatch between the $CTE_{silicon}$ and the $CTE_{encapsulant}$ defines a thermal stress interface between the silicon region and the encapsulant. A dielectric layer is formed over the first die and the encapsulant, the dielectric layer including a dielectric spacer region extending over and laterally across the thermal stress interface. A redistribution layer (RDL) is formed, including an RDL element extending over the dielectric spacer region, the RDL element electrically connected to the conductive contact of the first die through a first opening in the dielectric layer. The RDL element is physically spaced apart from the thermal stress interface by the dielectric spacer region.

In some examples, the $CTE_{DSR}$ differs from the $CTE_{encapsulant}$ by less than 50% of the $CTE_{encapsulant}$. In some examples, a CTE mismatch between the $CTE_{DSR}$ and the $CTE_{encapsulant}$ is less than 50% of a CTE mismatch between the $CTE_{silicon}$ and the $CTE_{encapsulant}$.

In some examples, the dielectric spacer region comprises a polymer.

In some examples, the method includes forming a through-mold via extending vertically through the encapsulant and laterally spaced apart from the first die, wherein the RDL element is electrically connected to the through-mold via through a second opening in the dielectric layer.

In some examples, the method includes mounting a second die to the first die in a face-to-face arrangement.

In some examples, the method includes forming alignment structures over the dielectric layer, the alignment structures comprising a polymer, and wherein mounting the second die to the first die in a face-to-face arrangement comprises (a) using the alignment structures to laterally align the second die relative to the first die in a face-to-face arrangement, wherein at least one of the second die and the first die is pre-bumped with an array of solder bumps, and (b) performing a reflow process to secure the second die to the first die.

One aspect provides an IC device, comprising a first die and a second die mounted to the first die in a face-to-face arrangement with a first side of the second die facing a first side of the first die. The first die includes an array of first die solder contacts and a plurality of conductive traces on the first side of the first die. The first die has a lateral outer perimeter defining a first die footprint. The second die includes an array of second die solder contacts respectively electrically connected to the array of first die solder contacts by respective solder bonds. The second die has a lateral outer perimeter defining a second die footprint. The IC devices includes an RDL including a plurality of RDL elements, wherein a respective RDL element of the plurality of RDL elements (a) is connected to a respective conductive trace of the plurality of conductive traces on the first side of the first die at a location within the lateral outer perimeter of the second die, and (b) extends laterally outside the lateral outer perimeter of the first die and outside the lateral outer perimeter of the second die, so that a portion of the respective RDL element is located between the first die and the second die in a vertical plane.

In some examples, the IC device includes an encapsulant laterally adjacent the first die, and a dielectric layer formed over the first die and the encapsulant, the dielectric layer including a dielectric spacer region extending over and laterally across an interface between the first die and the encapsulant laterally adjacent the first die, wherein the respective RDL element is formed over the dielectric spacer region and electrically connected to the respective conductive trace on the first side of the first die through a first opening in the dielectric layer, and wherein the respective RDL element is physically spaced apart from the interface between the first die and the encapsulant by the dielectric spacer region.

In some examples, the first die includes a silicon region having a coefficient of thermal expansion ($CTE_{silicon}$), and the encapsulant laterally adjacent the first die has a coefficient of thermal expansion ($CTE_{encapsulant}$), wherein the $CTE_{silicon}$ differs from the $CTE_{encapsulant}$ by at least 75% of the $CTE_{encapsulant}$, and wherein a coefficient of thermal expansion of the dielectric spacer region ($CTE_{DSR}$) differs from the $CTE_{encapsulant}$ by less than 50% of the $CTE_{encapsulant}$.

In some examples, the dielectric spacer region has a coefficient of thermal expansion ($CTE_{DSR}$), and a CTE mismatch between the $CTE_{DSR}$ and the $CTE_{encapsulant}$ is less than 50% of a CTE mismatch between the $CTE_{silicon}$ and the $CTE_{encapsulant}$.

In some examples, an area of the second die footprint differs from an area of the first die footprint by less than 25%.

In some examples, the second die is spaced apart from the respective RDL element by at least one dielectric cover layer.

BRIEF DESCRIPTION OF THE DRAWINGS

Example aspects of the present disclosure are described below in conjunction with the figures, in which.

It should be understood that the reference number for any illustrated element that appears in multiple different figures has the same meaning across the multiple figures, and the mention or discussion herein of any illustrated element in the context of any particular figure also applies to each other figure, if any, in which that same illustrated element is shown.

DETAILED DESCRIPTION

Figure 1:
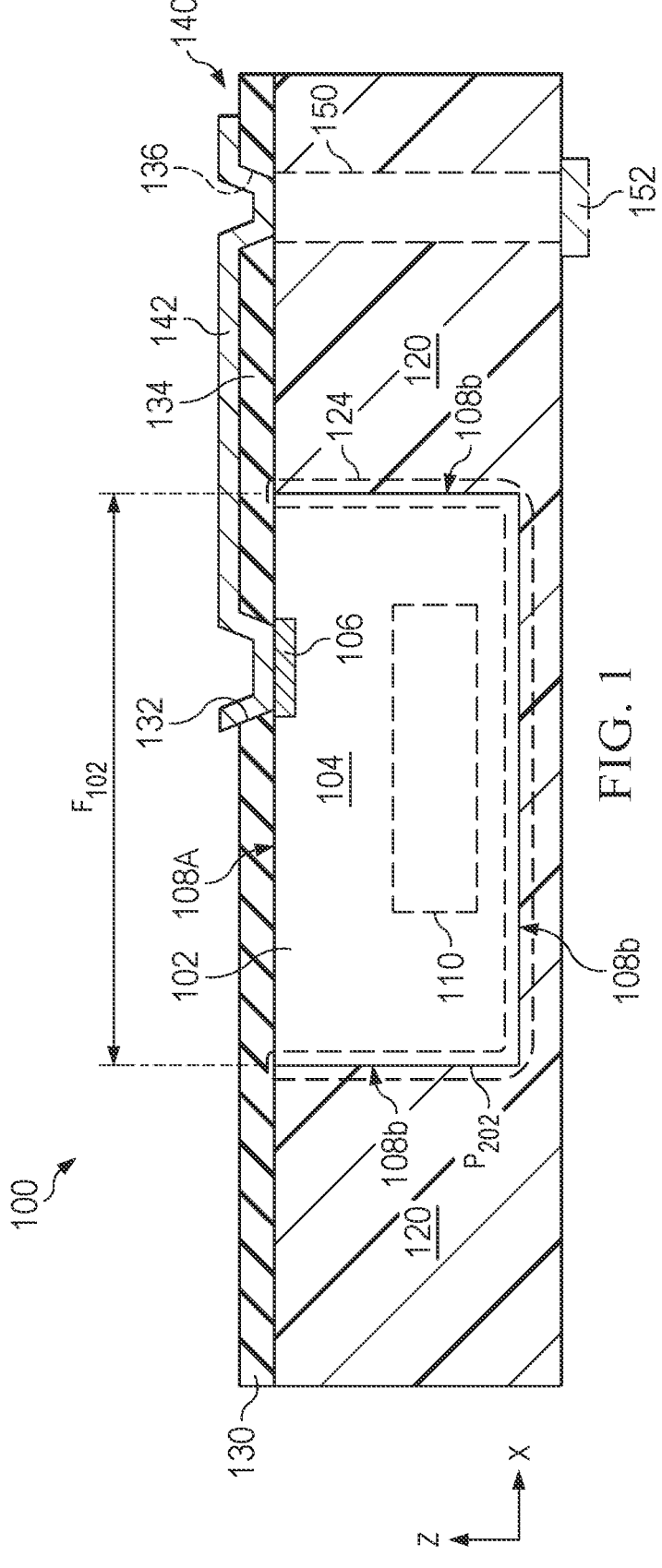
FIG. 1 shows an example IC device including a redistribution layer (RDL) element spaced apart from a thermal stress interface by a dielectric spacer region extending over the thermal stress interface, to thereby reduce stresses experienced by the RDL element.

FIG. 1 shows an example IC device 100 including a conductive element (an RDL element) spaced apart from a thermal stress interface in the IC device 100 by a dielectric spacer region extending over the thermal stress interface, to thereby reduce stresses experienced by the RDL element. In some examples the example IC device 100 may comprise a portion of a multi-die assembly, e.g., any of the example multi-die assemblies shown in FIGS. 2A-2B or FIG. 3.

As shown in FIG. 1, the example IC device 100 includes an IC die 102 (or die 102) including a silicon region 104 and a conductive contact 106 on a first side 108a (e.g., a top side) of the die 102. The die 102 may comprise, for example, a digital chiplet or an analog chiplet, including circuitry 110 for providing functionality of the IC device 100. The silicon region 104 has a coefficient of thermal expansion ($CTE_{silicon}$), discussed below.

The conductive contact 106 may comprise a bond pad, metal line or trace (e.g., formed in a top metal layer), or other contact element connected to respective circuitry 110 in the die 102, to provide electrical connection to the respective circuitry 110. In some examples, the conductive contact 106 may comprise an aluminum input/output (I/O) bond pad.

The die 102 is partially encapsulated by an encapsulant 120. In the illustrated example, selected sides 108b (e.g., a bottom side and lateral sides) of the die 102 are at least partially encapsulated by (i.e., covered by) the encapsulant 120, whereas the first side 108a is exposed through (i.e., uncovered by) the encapsulant 120. In some examples, the encapsulant 120 comprises an epoxy molding compound (EMC) or other polymer.

The encapsulant 120 has a coefficient of thermal expansion ($CTE_{encapsulant}$) that differs from the ($CTE_{silicon}$) of the silicon region 104, defining a "silicon/encapsulant CTE mismatch" between the encapsulant 120 and the silicon region 104. For example, in some examples the silicon region 104 has a $CTE_{silicon}$ in the range of 2.6-3.3 ppm/C, whereas the encapsulant 120 comprises an EMC having a $CTE_{encapsulant}$ in the range of 34-38 ppm/C. The silicon/ encapsulant CTE mismatch may be expressed as $CTE_{silicon}$ minus $CTE_{encapsulant}$.

The silicon/encapsulant CTE mismatch creates thermal stresses in areas where the encapsulant 120 interfaces the silicon region 104, referred to herein at "thermal stress interfaces" between the encapsulant 120 and silicon region 104. In the arrangement shown in FIG. 1, thermal stress interfaces, indicated at 124, are exhibited between respective sides 108b of the die 102 and the adjacent encapsulant 120.

As shown in FIG. 1, a dielectric layer 130 is formed over (and at least partially covers) the first die 102 and encapsulant 120. The dielectric layer 130 may comprise a polymer, for example, polyimide, polybenzobisoxazole (PBO), epoxy, rubber, or other polymer.

A redistribution layer (RDL) 140 is formed over the dielectric layer 130. The RDL 140 may include an RDL element 142 connected to the die 102 (as discussed below) and optionally one or more additional RDL elements (not shown). The RDL element 142 is electrically connected to the conductive contact 106 of the die 102 through a first opening 132 in the dielectric layer 130.

As shown, the RDL element 142 is physically spaced apart from (in the illustrated example, raised above) the nearby thermal stress interface 124 by a portion of the dielectric layer 130, referred to as a dielectric spacer region 134 that extends over and laterally across the thermal stress interface 124.

The dielectric spacer region 134 between the RDL element 142 and the first side 108a of the die 102 may reduce stresses experienced by the RDL element 142 caused by the underlying thermal stress interface 124, as compared with an alternative arrangement in which the RDL element 142 is formed directly on the first side 108a of the die 102 (i.e., an arrangement that omits the dielectric spacer region 134. In some examples, the dielectric spacer region 134 reduce stresses experienced by the RDL element 142 due to the underlying thermal stress interface 124 by at least 50%, at least 75%, or at least 90% as compared with the alternative arrangement discussed above (i.e., an arrangement omitting the dielectric spacer region 134).

To provide the stress reduction described above, the dielectric spacer region 134 may be formed from a material having a CTE ($CTE_{DSR}$) substantially similar to the $CTE_{encapsulant}$. In some examples, the $CTE_{DSR}$ of dielectric spacer region 134 may differ from the $CTE_{encapsulant}$ by less than 50% as a percentage of the $CTE_{encapsulant}$, which may provide an advantageous stress reduction; or less than 25% as a percentage of the $CTE_{encapsulant}$, which may provide a further advantageous stress reduction; or less than 10% as a percentage of the $CTE_{encapsulant}$, which may provide an even further advantageous stress reduction.

In addition, or alternatively, in some example a dielectric spacer/encapsulant CTE mismatch between the dielectric spacer region 134 and encapsulant 120 (i.e., $CTE_{DSR}$ minus $CTE_{encapsulant}$) is less than 50% of the silicon/encapsulant CTE mismatch (i.e., $CTE_{silicon}$ minus $CTE_{encapsulant}$), which may provide an advantageous stress reduction; or less than 25% of the silicon/encapsulant CTE mismatch, which may provide a further advantageous stress reduction); or less than 10% of the silicon/encapsulant CTE mismatch, which may provide an even further advantageous stress reduction. As noted above, in some examples the dielectric spacer region 134 may be formed from or comprise polyimide, PBO, epoxy, rubber, or other polymer.

As shown in FIG. 1, in some examples the RDL element 142 may connect to the conductive contact 106 at a location within a die footprint $F_{102}$ of the die 102 defined by a lateral outer perimeter $P_{102}$ of the first die 102, and the RDL element 142 may extend laterally outside the die footprint $F_{102}$, e.g., to provide connectivity to external electronics (e.g., electronics distinct from the IC device 100). For example, as shown FIG. 1, in some examples the RDL element 142 may be electrically connected to an optional package contact 152 (e.g., a back-side contact) through an optional through-mold via 150 spaced apart from the die 102 and extend through an optional second opening 136 in the dielectric layer 130. The RDL element 142, through-mold via 150, and package contact 152 may provide electrical connectivity (through the through-mold via 150 and RDL element 142) between the circuitry 110 of die 102 and respective external electronics. Alternatively (e.g., in contrast to back-side connectivity through the package contact 152 and through-mold via 150), the RDL element 142 may provide front-side connectivity to external electronics, e.g., at a location on the first side 108a.

Figure 2A:
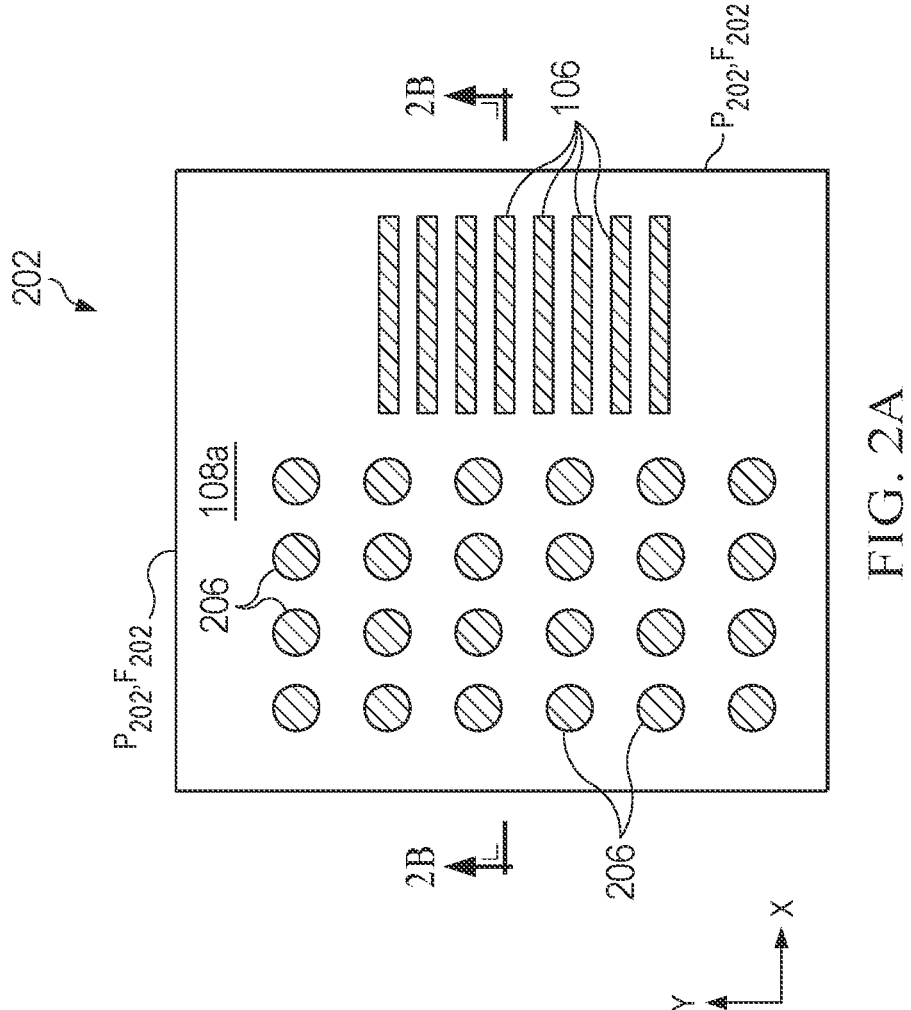
FIGS. 2A and 2B show a top cross-sectional view and a side cross-sectional view, respectively, of an example multi-die assembly including a first die and a second mounted in a face-to-face arrangement.
Figure 2B:
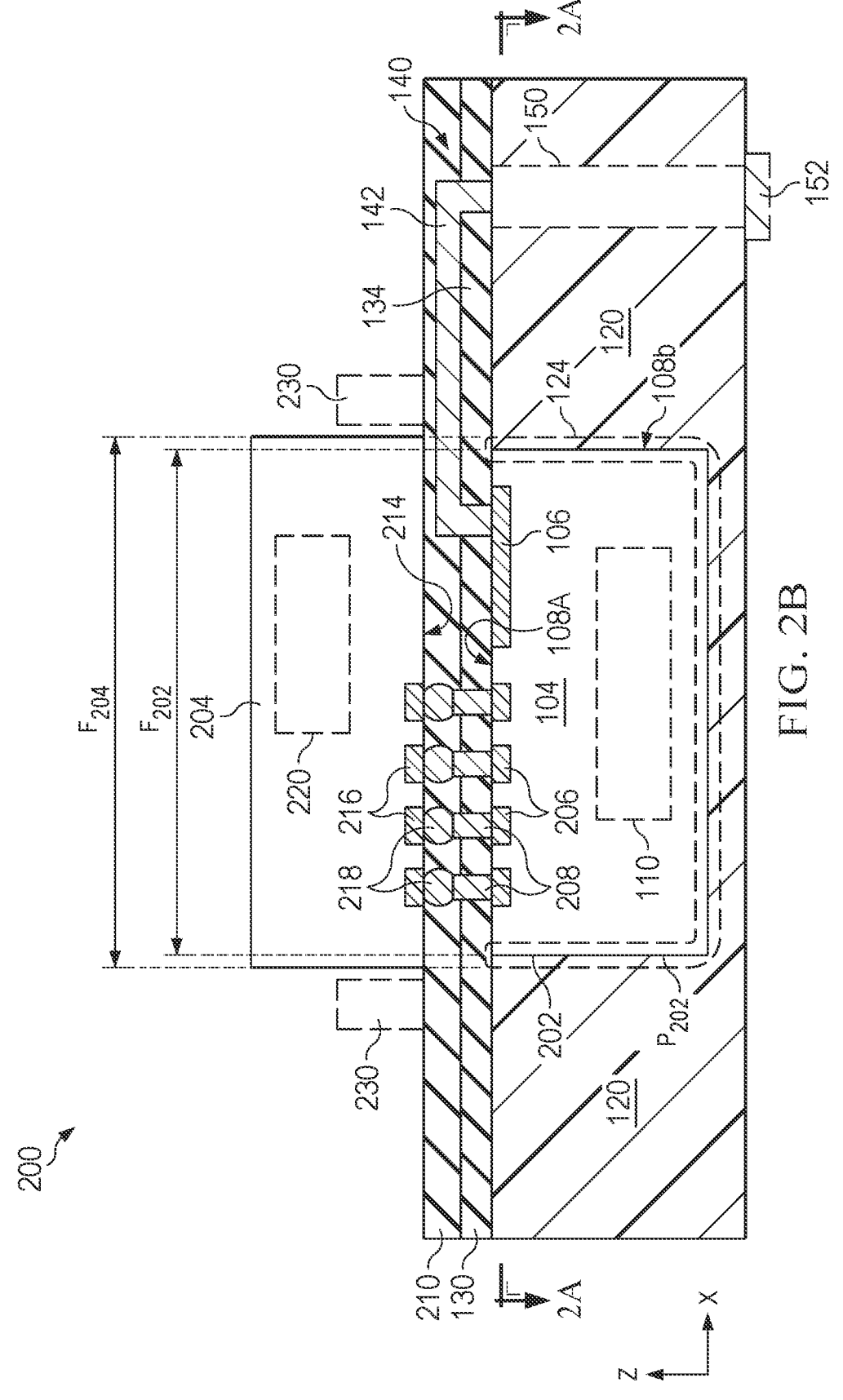

FIGS. 2A and 2B show a top cross-sectional view and a side cross-sectional view, respectively, of an example multi-die assembly 200. The top cross-sectional view of FIG. 2A is taken through line 2A-2A shown in FIG. 2B, and the side cross-sectional view of FIG. 2B is taken through line 2B-2B shown in FIG. 2A.

The example multi-die assembly 200 includes a first IC die 202 (or first die 202) and a second IC die 204 (or second die 204) mounted to each other in a face-to-face arrangement. The first die 202 and second die 204 may comprise different types of dies (e.g., an analog die and a digital die), in which case the multi-die assembly 200 may be referred to as a heterogeneous multi-die assembly.

The first die 202 may be similar to the die 102 shown in FIG. 1 and discussed above, with like reference numbers referring to like parts. Accordingly, the first die 202 may include the silicon region 104, and the conductive contact 106 on the first side 108a (e.g., top side) of the die 202 and connected to respective circuitry 110 in the first die 202. As shown in FIG. 2A, the first die 202 may include a plurality of conductive contacts 106, wherein the conductive contact 106 shown in FIG. 2B represents a respective one of the conductive contacts 106. In some examples, the conductive contacts 106 comprise metal traces formed on the first side 108a of the first die 202.

Respective conductive contacts 106 may be contacted by respective RDL elements, e.g., for communication of electrical signals to and/or from respective circuitry 110 of the first die 202. For example, as shown in FIG. 2B, the RDL 140 includes the respective RDL element 142 contacting the respective conductive contact 106. The respective RDL element 142 may connect to the respective conductive contact 106 at a location within a first die footprint $F_{202}$ defined by a lateral outer perimeter $P_{202}$ of the first die 202, and extend laterally outside the first die footprint $F_{202}$, e.g., to provide connectivity to external electronics (e.g., electronics distinct from the multi-die assembly 200). In the illustrated example, a first end of the respective RDL element 142 may connect to the respective conductive contact 106 (within the first die footprint $F_{202}$), and a second end of the respective RDL element 142 may connect to the optional through-hole via 150 (located outside the first die footprint $F_{202}$), e.g., to provide connectivity to external electronics via the package pad 152 formed on the through-hole via 150. Alternatively, the RDL element 142 may provide front-side connectivity to external electronics, e.g., at a location on the first side 108a of the first die 102.

As shown in FIGS. 2A and 2B, the first die 202 may also include an array of first die solder contacts 206 on the first side 108a of the first die 202. The first die solder contacts 206 may comprise solder-wettable pads or other contacts for forming solder bond connections to respective circuitry 110 of the first die 202, e.g., as discussed below.

The first die 202 is partially encapsulated by the encapsulant 120, e.g., comprising EMC or other polymer. In particular, sides 108b (e.g., bottom side and lateral sides) of the first die 202 are at least partially encapsulated by (i.e., covered by) the encapsulant 120, whereas the first side 108a of the first die 202 is exposed through (i.e., uncovered by) the encapsulant 120.

As discussed above, the $CTE_{encapsulant}$ of the encapsulant 120 and the $CTE_{silicon}$ of the silicon region 104 define a silicon/encapsulant CTE mismatch, which creates thermal stresses in thermal stress interfaces 124 between the silicon region 104 and the encapsulant 120.

As discussed above, to reduce the effects of these thermal stress interfaces 124 on conductive elements connected to the first die 202, for example the RDL element 142 connected to the conductive contact 106 (e.g., metal trace), the dielectric layer 130 is formed over the second die 202 to physically separate respective conductive elements (e.g., RDL element 142 and/or other RDL structures) from respective thermal stress interfaces 124. For example, the dielectric layer 130 defines the dielectric spacer region 134 extending over and laterally across the thermal stress interface 124, so that the dielectric spacer region 134 is arranged between the RDL element 142 and underlying thermal stress interface 124. As discussed above, the dielectric layer 130 (including the dielectric spacer region 134) may be formed from a material having a CTE ($CTE_{DSR}$) substantially similar to the $CTE_{encapsulant}$, for example polyimide, PBO, epoxy, rubber, or other polymer, to thereby reduces the effects of thermal stress interfaces 124 on the RDL element 142 and/or other conductive elements formed over the second die 202.

As shown in FIG. 2B, at least one additional dielectric layer (or "dielectric cover layer") 210 may be formed over the RDL 140. It should be understood that the multi-die assembly 200 may include an RDL region including multiple RDL layers separated by multiple dielectric layers, wherein RDL 140 represents a respective one of the multiple RDL layers.

The second die 204 includes an array of second die solder contacts 216 connected to respective second die circuitry 220. The second die 204 is mounted to the first die 202 in a face-to-face arrangement, with a first side 214 (e.g., top side or front side) of the second die 204 facing the first side 108a (e.g., top side or front side) of the first die 202.

Respective second die solder contacts 216 of the array of second die solder contacts 216 are electrically connected to the respective first die solder contacts 206 of the array of first die solder contacts 206 by respective solder bonds formed during the mounting of second die 204 to the first die 202. Respective second die solder contacts 216 may be solder bonded to respective first die solder contacts 206 either directly (e.g., with no intervening structures) or indirectly (e.g., with intervening structures). In the example shown in FIG. 2B, respective second die solder contacts 216 are indirectly solder bonded to respective first die solder contacts 206. In particular, respective second die solder contacts 216 are solder bonded, by respective solder bumps or solder balls 218, to conductive micro-via contact pads 208 formed on respective first die solder contacts 206. In some examples, the conductive micro-via contact pads 208 may be formed concurrently with the RDL 140. In some examples, the second die 204 may be "pre-bumped" with solder bumps 218, which solder bumps 218 may be aligned with and mounted to respective micro-via contact pads 208 during mounting of the second die 204 to the first die 202.

In other examples, the first die 202 may be pre-bumped with solder bumps, which solder bumps may be aligned with, and mounted to, second die solder contacts 216 (or respective micro-via contact pads or other conductive structures formed on the second die solder contacts 216) during mounting of the second die 204 to the first die 202. In other examples, neither the first die 202 nor the second die 204 are pre-bumped, wherein solder may be applied during the process of mounting the first die 202 to the second die 204.

In some examples, the multi-die assembly 200 includes optional alignment structures 230 to align the second die 204 relative to the first die 202, e.g., in the x-direction and/or y-direction.

The second die 204 has a lateral outer perimeter $P_{204}$ defining a second die footprint $F_{204}$. In the illustrated example, the respective RDL element 142 extends laterally outside both the first die footprint $F_{202}$ and the second die footprint $F_{204}$, so that a first portion of the respective RDL element 142 is located between the first die 202 and the second die 204 in a vertical plane (y-z plane), and a second portion of the respective RDL element 142 is not located between the first die 202 and the second die 204 in a vertical plane. For example, in some examples, an area of the second die footprint $F_{204}$ may be the same or similar to (e.g., differing by less than 25% from) an area of the first die footprint $F_{202}$, wherein the respective RDL element 142 extends outside both the first die footprint $F_{202}$ and the second die footprint $F_{204}$. In other examples, the area of the second die footprint $F_{204}$ is substantially larger than (e.g., at least 25% greater than) the area of the first die footprint $F_{202}$ (e.g., such that the second die footprint $F_{204}$ overhangs the first die footprint $F_{202}$), and wherein the respective RDL element 142 extends outside both the first die footprint $F_{202}$ and the second die footprint $F_{204}$. In other examples in which the area of the second die footprint $F_{204}$ is substantially larger than (e.g., at least 25% greater than) the area of the first die footprint $F_{202}$ (e.g., such that the second die footprint $F_{204}$ overhangs the first die footprint $F_{202}$), the respective RDL element 142 may extend laterally outside the first die footprint $F_{202}$, but not outside the larger second die footprint $F_{204}$ (e.g., the respective RDL element 142 may be fully located within the second die footprint $F_{204}$).

As discussed above, the respective RDL element 142 may extend laterally outside the first die footprint $F_{202}$, e.g., to provide connectivity to external electronics (e.g., electronics distinct from the multi-die assembly 200) at a location outside the first die footprint $F_{202}$, for example back-side connectivity via optional package pad 152 and through-hole via 150, or front-side connectivity via a contact (not shown) on the first side 108a of the first die 202. Thus, in some examples, respective RDL elements 142 connected to respective conductive contacts 106 to provide connectivity to external electronics may provide the function typically provided by solder pads and wire-bonds in a conventional device, for example, wire bonds connected between solder pads provided on the front side of the conventional device and external contacts, e.g., IC package pins or leads or bond pads on a printed circuit board (PCB). Accordingly, the use of RDL elements 142 connected directly (i.e., without solder bonds) to respective conductive contacts 106 to provide connectivity to external electronics may allow for the elimination or reduction of wire bonds in certain devices, which may improve the durability of the respective devices.

In addition, the use of RDL elements 142 connected directly to respective conductive contacts 106 may provide sizing or spacing advantages. In some examples, direct connections between respective RDL elements 142 and respective conductive contacts 106 (e.g., metal traces) may be formed with smaller dimensions (e.g., in the x-direction and/or y-direction) than soldered wire bonds in a conventional device. Thus, in some examples adjacent conductive contacts 106 may be formed closed together (i.e., with smaller spacing between adjacent conductive contacts 106 in the x-direction and/or y-direction) than adjacent wire bond pads in a conventional device, thereby allowing higher input-output (I/O) connection density on the respective device, for example.

Figure 3:
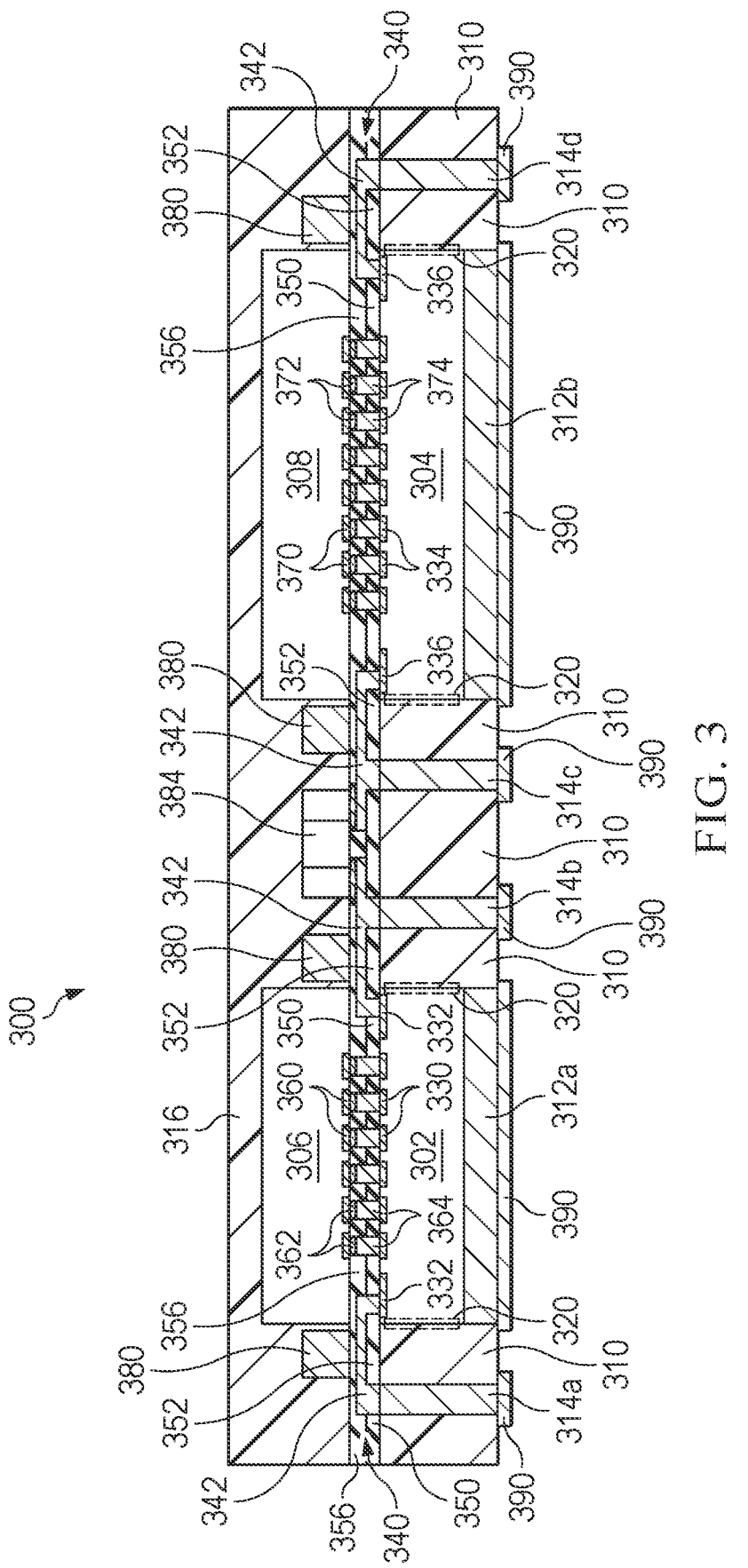
FIG. 3 shows an example multi-die IC device including two pairs of dies mounted in a stacked, face-to-face orientation.

FIG. 3 shows an example multi-die IC device 300 including multiple dies mounted in a stacked, face-to-face orientation. In particular, the example multi-die IC device 300 includes (a) a first die 302, (b) a second die 304, a third die 306 mounted to the first die 302 in a face-to-face arrangement, and (d) a fourth die 308 mounted to the third die 306 in a face-to-face arrangement. The first die 302 and the third die 306 may define a first multi-die assembly (e.g., arranged similarly as the example multi-die assembly 200 discussed above), and the second die 304 and the fourth die 308 may define a second multi-die assembly (e.g., arranged similarly as the example multi-die assembly 200 discussed above).

In some examples, the multi-die IC device 300 may be formed using PLP processing, for example wherein an array of similar multi-die IC devices 300 are formed on a single panel and then singulated, wherein the multi-die IC device 300 shown in FIG. 3 represents a respective singulated instance of the array of similar multi-die IC devices. In some examples, multiple instances of the first die 302 and second die 304 may be arranged in pairs on a common panel, wherein a respective pair includes a respective instance of the first die 302 arranged adjacent a respective instance of the second die 304. Respective instances of the third die 306 and fourth die 308 may be mounted on respective instances of the first die 302 and second die 304, to form multiple multi-die structures on the common panel (with respective multi-die structures including a respective instance of the first die 302, second die 304, third die 306, and fourth die 308), and the multiple multi-die structures may then be singulated to form multiple discrete (singulated) instances of the multi-die IC device 300.

The first die 302, second die 304, third die 306, and fourth die 308 may respectively comprise any types of IC dies. For example, the first die 302, second die 304, third die 306, and fourth die 308 may comprise different types of dies (e.g., including at least one analog die and at least one digital die), or alternatively two or more of the first die 302, second die 304, third die 306, and fourth die 308 may comprise similar types of dies.

As shown in FIG. 3, the first die 302 and second die 304 are partially encapsulated by an encapsulant 310, e.g., comprising EMC or other polymer. In this example, backside plates 312a and 312b are coupled to a backside of the first die 302 and a backside of second die 304, respectively. Conductive through-vias 314a-314d extending through the encapsulant 310 are formed spaced apart from the first die 302 and second die 304.

The first die 302 and second die 304 comprise silicon, wherein the $CTE_{silicon}$ of the silicon of the first die 302 and second die 304 and the $CTE_{encapsulant}$ of the encapsulant 310 defines a silicon/encapsulant CTE mismatch that creates thermal stress interfaces 320 between the encapsulant 310 and respective ones of the first die 302 and second die 304, as shown in FIG. 3.

The first die 302 may include first die solder contacts 330 (e.g., solder-wettable pads) and first die conductive contacts 332 (e.g., metal traces) respectively connected to respective circuitry in the first die 302. Similarly, the second die 304 may include second die solder contacts 334 (e.g., solder-wettable pads) and second die conductive contacts 336 (e.g., metal traces) respectively connected to respective circuitry in the second die 304.

An RDL region including RDL 340 formed over the first die 302 and second die 304 includes respective RDL elements 342 connected to respective first die conductive contacts 332 and second die conductive contacts 336. In the illustrated example, respective RDL elements 342 are also connected to respective through-vias 314a-314d, to provide electrical connections to the first die 302 and second die 304 by external devices.

A dielectric layer 350 is formed between the first die 302 and second die 304 and the RDL 340 to reduce the effects of the thermal stress interfaces 320 on respective RDL elements 342. In particular, respective portions of the dielectric layer 350 define respective dielectric spacer regions 352 located between respective RDL elements 342 and respective underlying thermal stress interfaces 320, wherein respective dielectric spacer regions 352 physically space respective RDL elements 342 away from respective underlying thermal stress interfaces 320, to thereby reduce the effects of the thermal stress interfaces 320 on the RDL elements 342.

As discussed above regarding dielectric layer 130, the dielectric layer 350 (including the dielectric spacer region 352) may be formed from a material having a CTE ($CTE_{DSR}$) substantially similar to the $CTE_{encapsulant}$ of the encapsulant 310, for example polyimide, PBO, epoxy, rubber, or other polymer.

As shown in FIG. 3, at least one additional dielectric layer (or "dielectric cover layer") 356 may be formed over the RDL 340. It should be understood that the device 300 may include an RDL region including multiple RDL layers separated by multiple dielectric layers, wherein RDL 340 represents a respective one of the multiple RDL layers. The at least one additional dielectric layer 356 may comprise, for example, polyimide, PBO, epoxy, rubber, or other polymer.

The third die 306 includes an array of third die solder contacts 360 connected to respective circuitry of the third die 306. The third die 306 is mounted to the first die 302 in a face-to-face arrangement, wherein respective third die solder contacts 360 are solder bonded (and thereby electrically connected) to respective first die solder contacts 330. Respective third die solder contacts 360 may be solder bonded to respective first die solder contacts 330 either directly (e.g., with no intervening structures) or indirectly (e.g., with intervening structures). In the example shown in FIG. 3, respective third die solder contacts 360 are solder bonded, by respective solder bumps or solder balls 362, to conductive micro-via contact pads 364 formed on respective first die solder contacts 330. In some examples, the conductive micro-via contact pads 364 formed on respective first die solder contacts 330 may be formed concurrently with the RDL 340.

Similarly, the fourth die 308 includes an array of fourth die solder contacts 370 connected to respective circuitry of the fourth die 308. The fourth die 308 is mounted to the second die 304 in a face-to-face arrangement, wherein respective fourth die solder contacts 370 are solder bonded (and thereby electrically connected) to respective second die solder contacts 334. Respective fourth die solder contacts 370 may be solder bonded to respective second die solder contacts 334 either directly (e.g., with no intervening structures) or indirectly (e.g., with intervening structures). In the example shown in FIG. 3, respective fourth die solder contacts 370 are solder bonded, by respective solder bumps or solder balls 372, to conductive micro-via contact pads 374 formed on respective second die solder contacts 334. In some examples, the conductive micro-via contact pads 364 formed on respective second die solder contacts 334 may be formed concurrently with the RDL 340.

In some examples, the multi-die IC device 300 includes respective alignment structures 380 to align the third die 306 relative to the first die 302, and to align the fourth die 308 relative to the second die 304, e.g., in the x-direction and/or y-direction.

Further, in some examples, the device 300 includes at least one passive component 384 connected between respective RDL elements 342 connected to the first die 302 and second die 304 to provide electrical connections between respective circuitry of the first die 302 and second die 304. The at least one passive component 384 may include at least one capacitor, resistor, inductor, transformer, and/or other passive component(s). The at least one passive component 384 may be solder bonded to the respective RDL elements 342, e.g., during a reflow process performed to solder bond the third die 306 to the first die 302 and solder bond the fourth die 308 to the second die 304.

An encapsulant 316, e.g., comprising EMC, may be formed over the third die 306 and fourth die 308, e.g., by an overmold process.

As shown in FIG. 3, respective package pads 390 may be formed on respective surfaces of the through-vias 314a-314d and respective surfaces (e.g., backside surfaces) of the backside plates 312a and 312b, to allow electrical connection between external electronics and respective circuitry of one or more of the first die 302, second die 304, third die 306, and/or fourth die 308.

As discussed above regarding RDL elements 142 of the example assembly shown in FIG. 2, the use of RDL elements 342 to provide connectivity to external electronics (e.g., electronics distinct from device 300) at a location outside the respective footprints of the first die 302 and second die 304 may provide one or more advantages over soldered wire bonds used in conventional devices. For example, the use of RDL elements 342 connected directly (i.e., without solder bonds) to respective conductive contacts 332, 336 to provide connectivity to external electronics may allow for the elimination or reduction of wire bonds in certain devices, which may improve the durability of the respective devices. In addition, using RDL elements 342 connected directly to respective conductive contacts 332, 336 may provide sizing or spacing advantages, e.g., allowing higher input-output (I/O) connection density on the respective device, as discussed above.

Figures 4A, 4B:
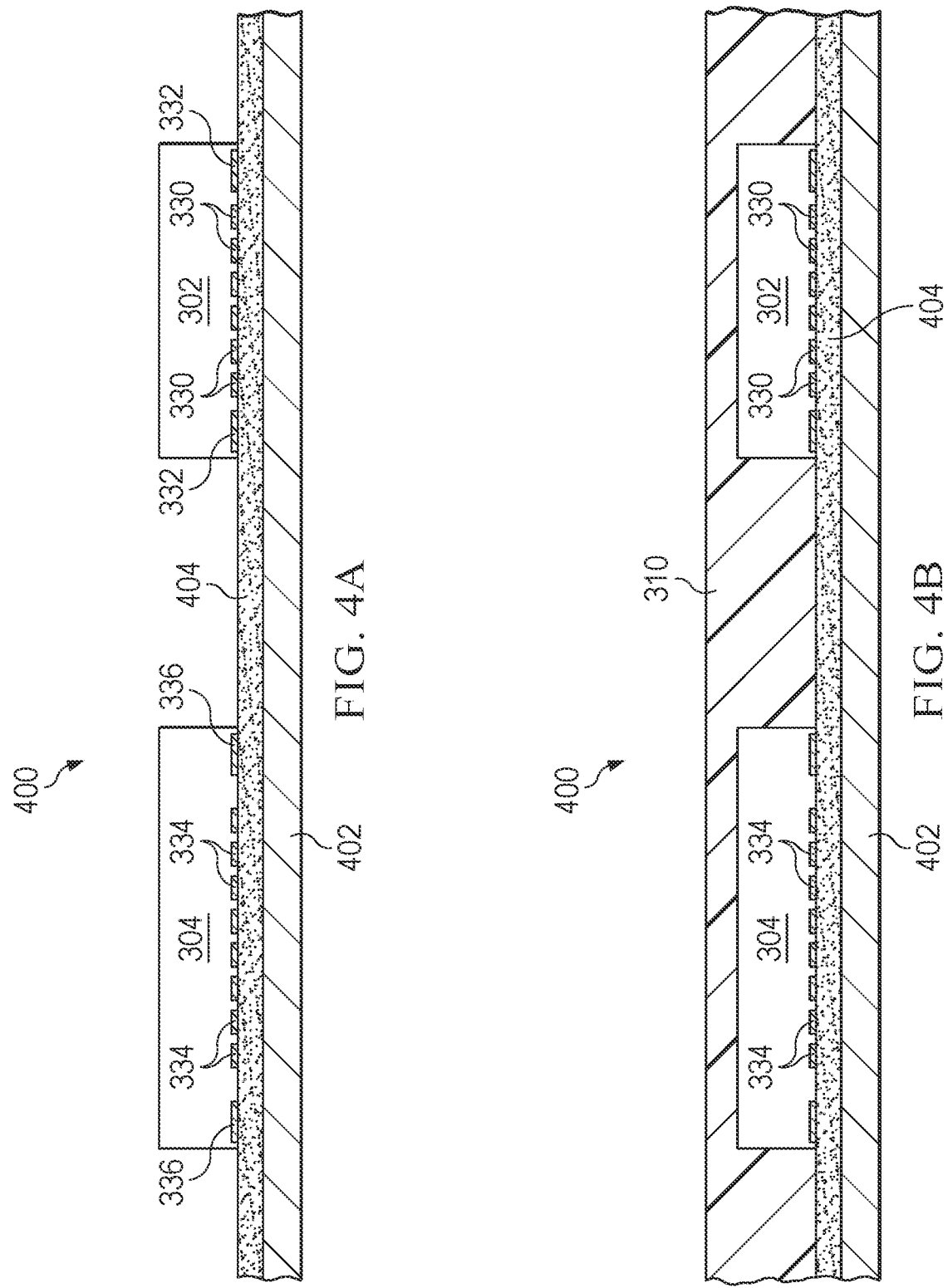
FIGS. 4A-4K show an example PLP method for forming the example multi-die IC device shown in FIG. 3.
Figures 4C, 4D:
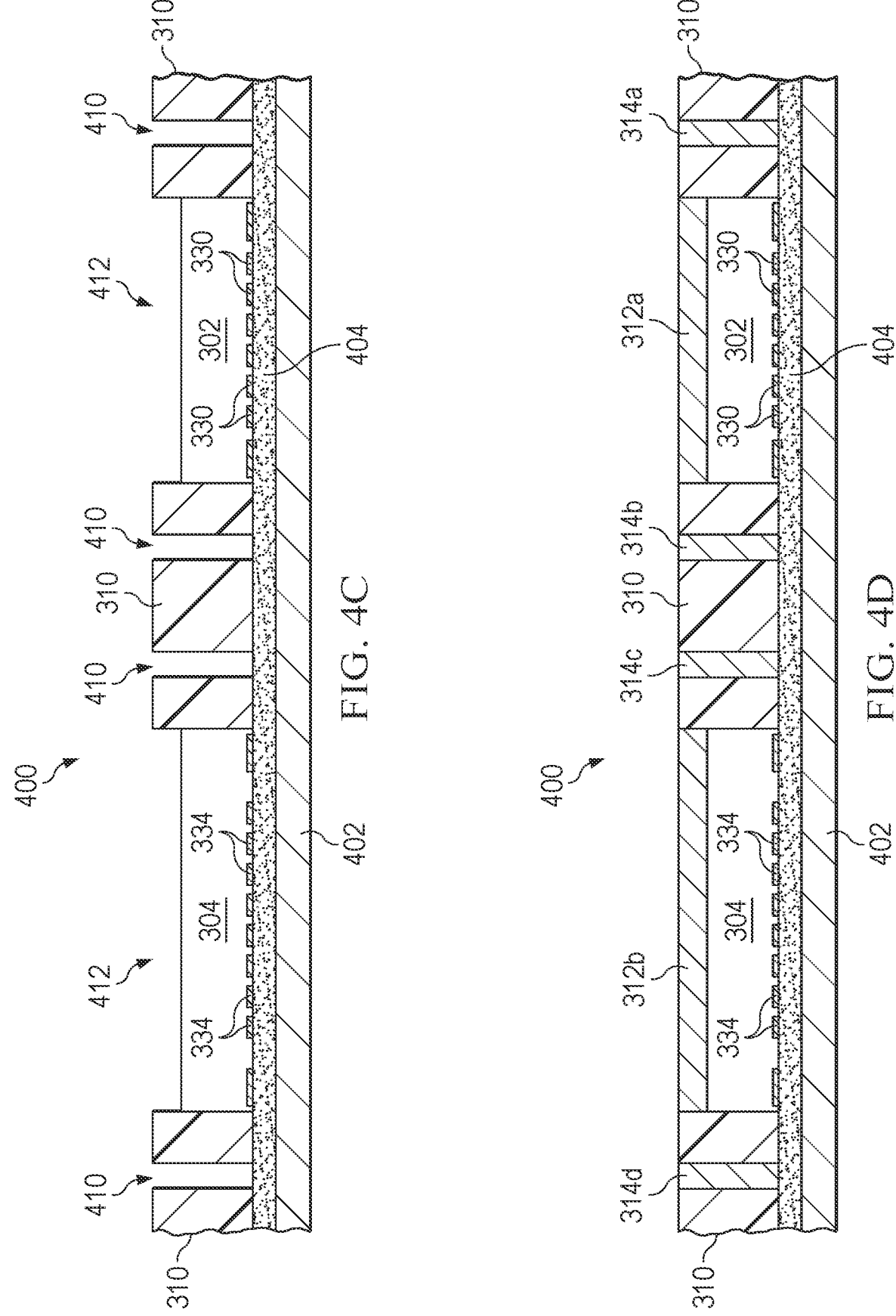
Figures 4E, 4F:
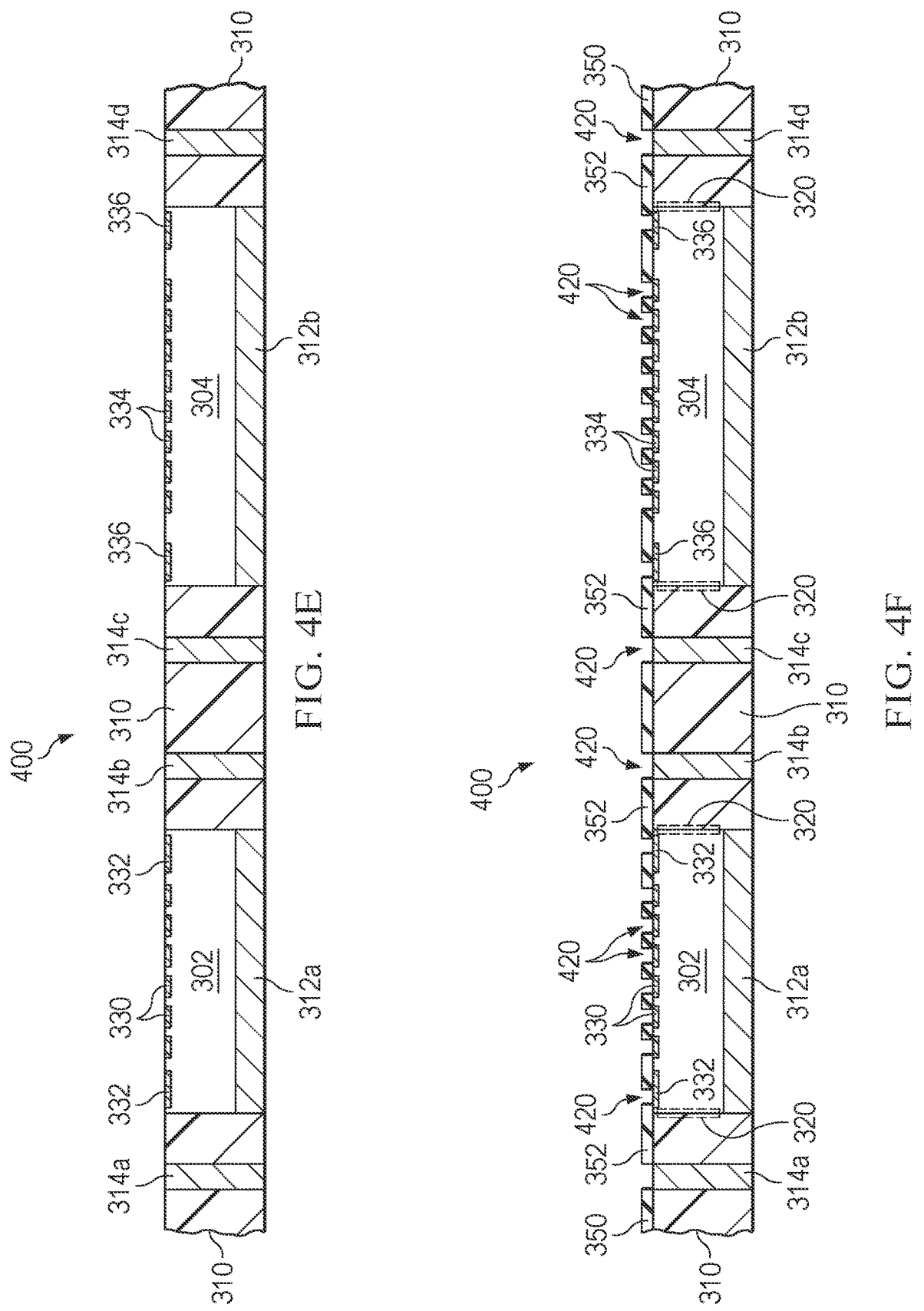
Figure 4G:
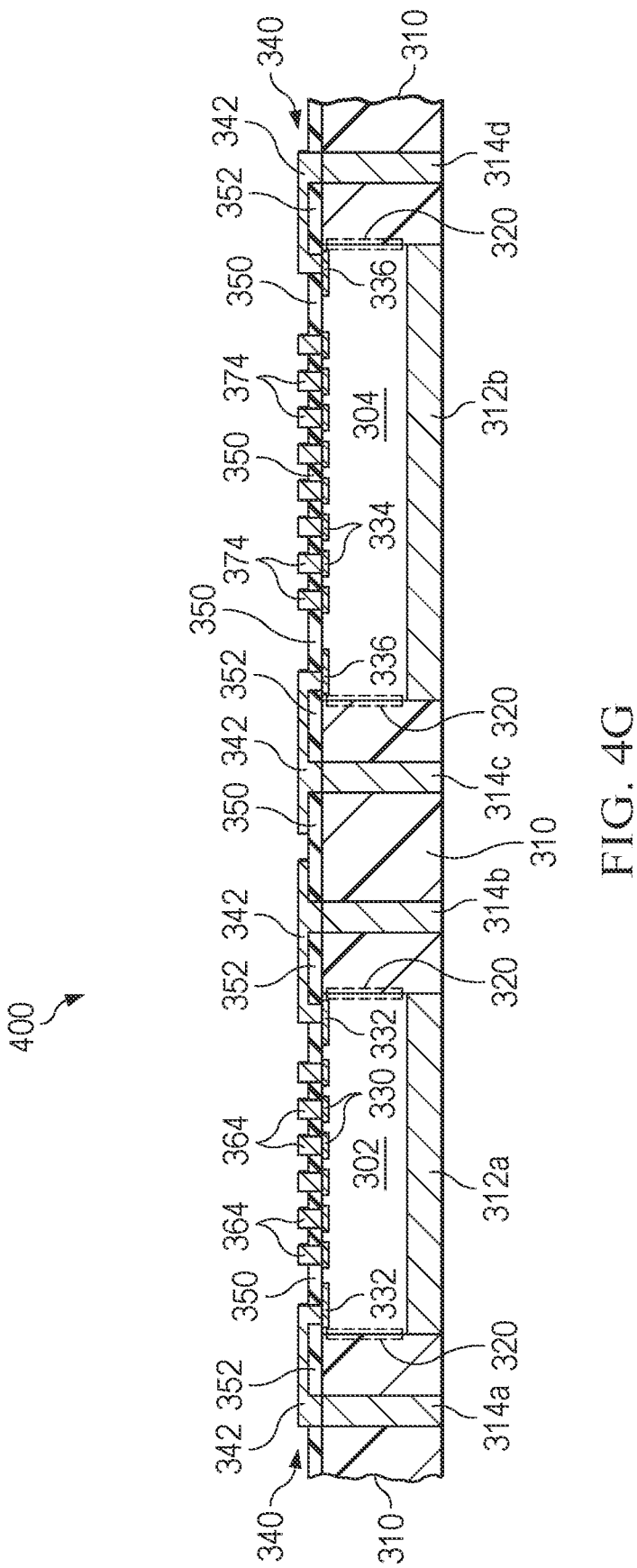
Figure 4H:
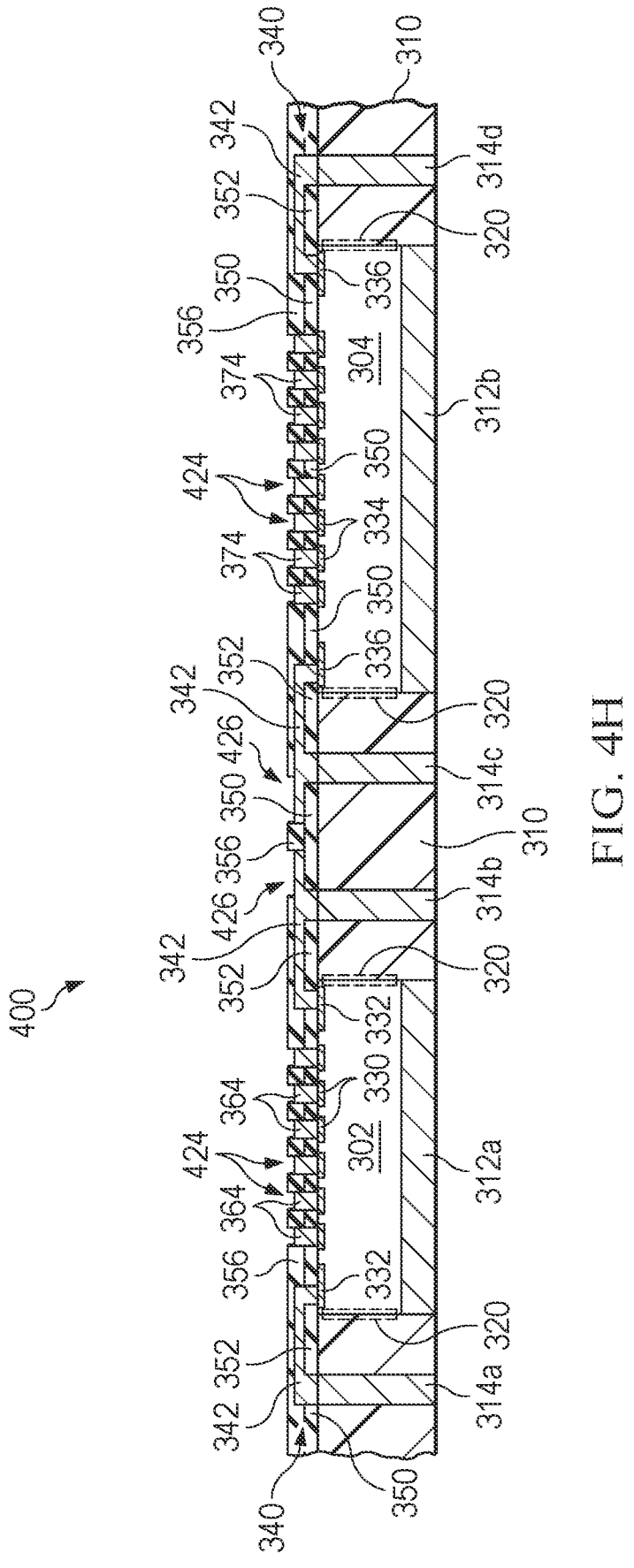
Figure 4I:
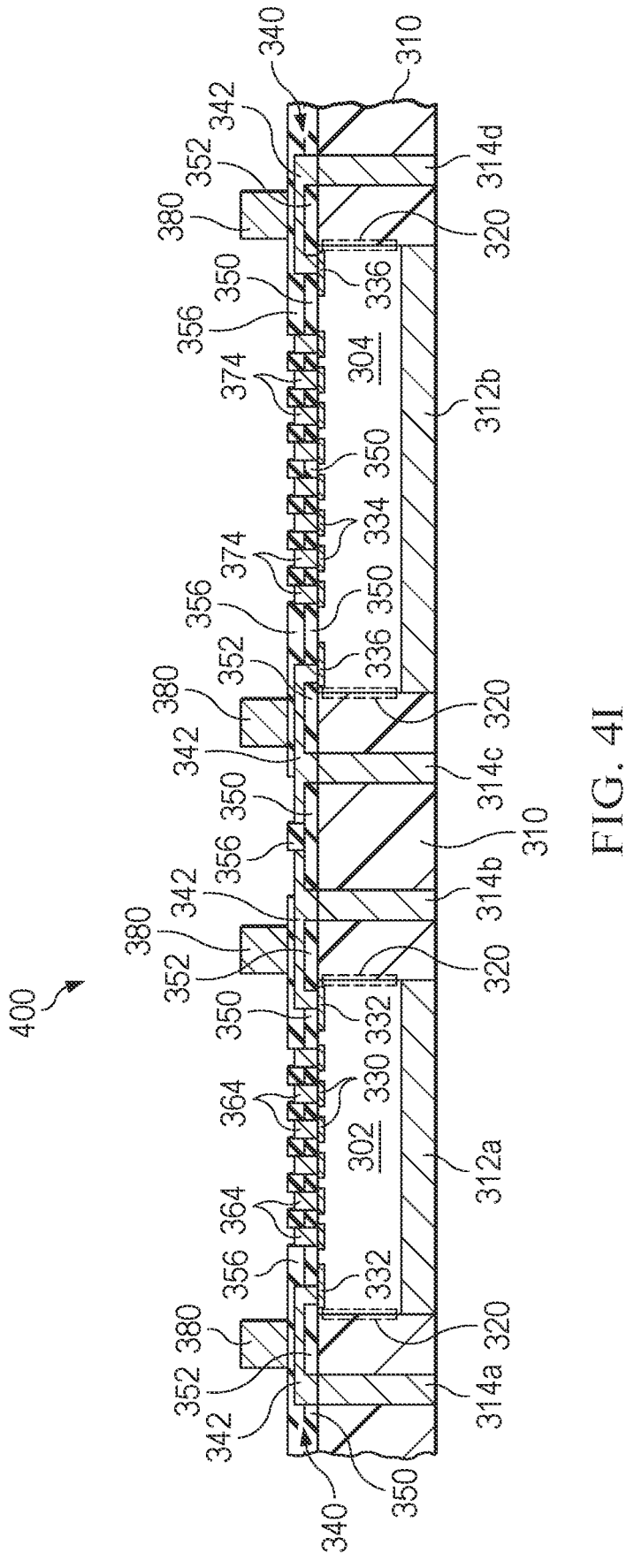
Figure 4J:
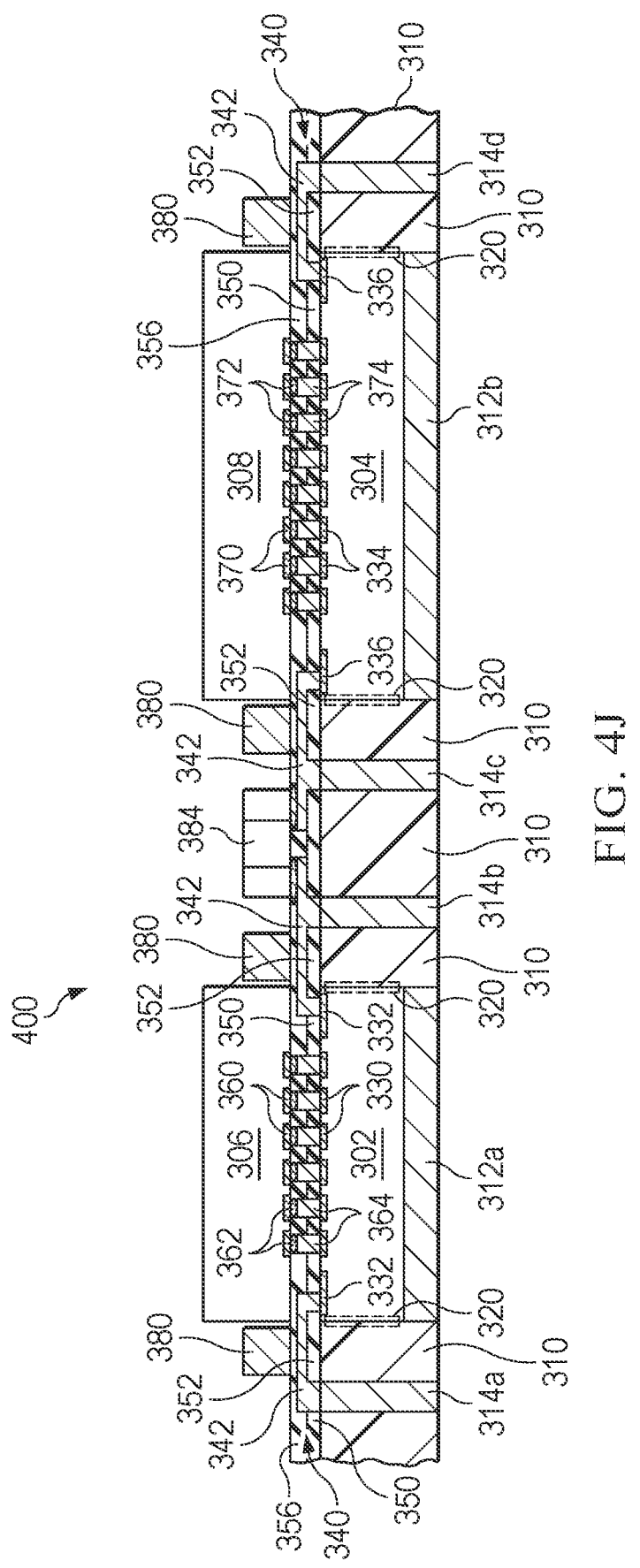
Figure 4K:
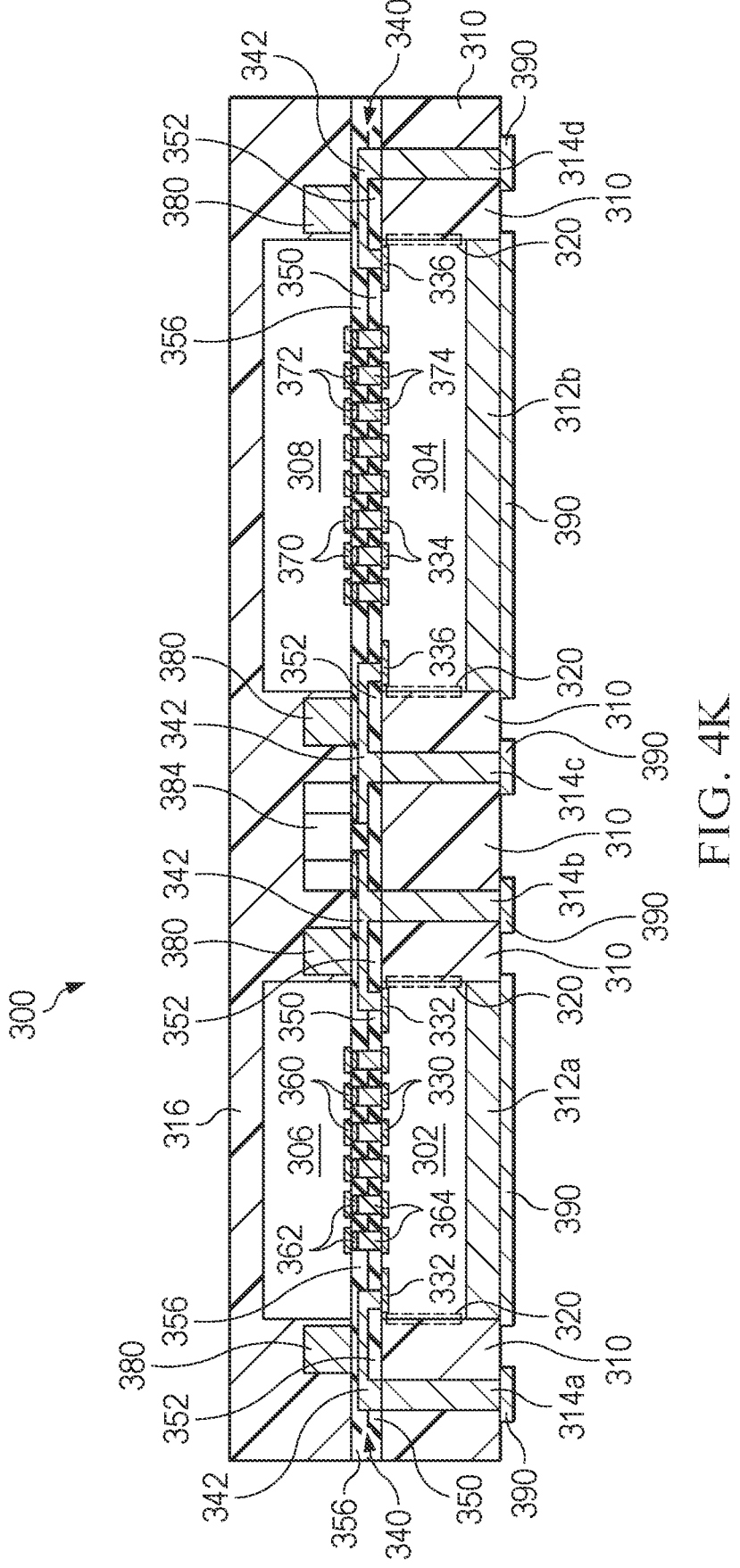

FIGS. 4A-4K show an example PLP method for forming the example multi-die IC device 300 shown in FIG. 3, e.g., wherein multiple instances of a multi-die assembly are formed concurrently on a common panel and then singulated to form multiple instances of the multi-die IC device 300. Accordingly, FIGS. 4A-4J show the formation of a panel-level structure 400, and FIG. 4K shows an instance of a multi-die IC device 300 provided by singulating the panel-level structure 400.

As shown in FIG. 4A, the first die 302 and second die 304 are mounted (e.g., using a pick and place machine) face-down on a panel-level carrier 402 with a heat release tape 404. The first die 302 includes the first die solder contacts 330 (e.g., solder-wettable pads) and first die conductive contacts 332 (e.g., metal traces), and the second die 304 includes the second die solder contacts 334 (e.g., solder-wettable pads) and second die conductive contacts 336 (e.g., metal traces).

As shown in FIG. 4B, the first die 302 and second die 304 are overmolded with the encapsulant 310, e.g., comprising EMC.

As shown in FIG. 4C, via openings 410 extending through the encapsulant 310, and backside die openings 412 exposing respective back sides of the first die 302 and second die 304, are formed in the encapsulant 310, e.g., using a laser drilling process.

As shown in FIG. 4D, via openings 410 and backside die openings 412 (shown in FIG. 4C) are filled to form through-vias 314a-314d and backside plates 312a and 312b, respectively, e.g., using a process including depositing a seed metal in the via openings 410 and backside die openings 412, copper plating over the seed metal, and performing a grind or other planarization process.

As shown in FIG. 4E, the heat release tape 404 may be activated to remove the panel-level carrier 402 (and heat release tape 404), leaving a panel-level structure 400, which is then flipped over.

As shown in FIG. 4F, the dielectric layer 350 is deposited on the panel-level structure 400, wherein the dielectric layer 350 includes openings 420 that expose respective surfaces of respective first die solder contacts 330, first die conductive contacts 332, second die solder contacts 334, second die conductive contacts 336, and through-vias 314a-314d. In one example, the dielectric layer 350 comprises a polyimide layer, wherein openings 420 are developed out of the polyimide layer. Regions of the dielectric layer 350 extending over respective thermal stress interfaces 320 (between the first die 302 or second die 304 and the encapsulant 310) define the respective dielectric spacer regions 352, discussed above.

As shown in FIG. 4G, the RDL 340 is formed, including respective RDL elements 342 connected (through respective openings 420 in the dielectric layer 350) to respective first die conductive contacts 332, second die conductive contacts 336, and through-vias 314a-314d, wherein respective RDL elements 342 are physically spaced apart from respective underlying thermal stress interfaces 320 by respective dielectric spacer regions 352, as discussed above. In addition, conductive micro-via contact pads 364 and 374 may be formed in contact (through respective openings 420 in the dielectric layer 350) with respective first die solder contacts 330 and second die solder contacts 334. The conductive micro-via contact pads 364 and 374 may be formed concurrently with, or using a distinct process from, the RDL 340.

As shown in FIG. 4H, the at least one additional dielectric layer 356 is formed on the structure 400, wherein the at least one additional dielectric layer 356 includes respective openings 424 that expose respective conductive micro-via contact pads 364 and 374, to allow solder bonding to the conductive micro-via contact pads 364 and 374, discussed below, and further openings 426 that expose respective surfaces of respective RDL elements 342 connected to the first die 302 and second die 304 (for forming connections between the first die 302 and second die 304, discussed below). In one example, the at least one additional dielectric layer 356 comprises a polyimide layer, wherein openings 424, 426 are developed out of the polyimide layer.

As shown in FIG. 4I, the optional alignment structures 380 may be formed on the structure 400. In some examples, the optional alignment structures 380 may comprise polyimide, PBO, epoxy or other organic polymer material.

As shown in FIG. 4J, the third die 306 is mounted to the first die 302 in a face-to-face arrangement, and the fourth die 308 is mounted to the second die 304 in a face-to-face arrangement. The respective third die 306 and fourth die 308 may be placed and aligned using a pick and place machine, wherein respective alignment structures 380 may facilitate the respective alignment of the third die 306 and fourth die 308 relative to the first die 302 and second die 304, respectively.

Respective third die solder contacts 360 of the third die 306 are solder bonded using respective solder bumps or solder balls 362 (aligned in respective openings 424 shown in FIG. 4H) to respective conductive micro-via contact pads 364 formed on respective first die solder contacts 330. Similarly, respective fourth die solder contacts 370 are solder bonded using respective solder bumps or balls 372 (aligned in respective openings 424 shown in FIG. 4H) to conductive micro-via contact pads 374 formed on respective second die solder contacts 334. In some examples, the third die 306 may be pre-bumped with the solder bumps or solder balls 362, and the fourth die 308 may be pre-bumped with the solder bumps or balls 372.

In addition, the at least one passive component 384 may be solder bonded (through respective openings 426 shown in FIG. 4H) to respective RDL elements 342 connected to the first die 302 and second die 304 to provide electrical connections between respective circuitry of the first die 302 and second die 304.

In some examples, a reflow process may be performed to form the respective solder connections, followed by a capillary underfill process to at least partially fill respective voids in the panel-level structure 400.

As shown in FIG. 4K, the third die 306 and fourth die 308 are overmolded with the encapsulant 316, e.g., comprising EMC. Package pads 390 may be formed on respective surfaces (e.g., backside surfaces) of the through-vias 314a-314d and backside plates 312a and 312b. The panel-level structure 400 may then be singulated to form multiple instances to form multiple instances of the multi-die IC device 300 shown in FIG. 3, wherein FIG. 4K shows a respective instance of the multi-die IC device 300.

Although example embodiments have been described above, other variations and embodiments may be made from this disclosure without departing from the spirit and scope of these embodiments.

The invention claimed is:

1. An integrated circuit (IC) device, comprising:
   a first die including:
   a silicon region having a coefficient of thermal expansion ($CTE_{silicon}$); and
   a conductive contact on a first side of the first die;
   an encapsulant laterally adjacent the silicon region of the first die, the encapsulant having a coefficient of thermal expansion ($CTE_{encapsulant}$);
   wherein a mismatch between the $CTE_{silicon}$ and the $CTE_{encapsulant}$ defines a thermal stress interface between the silicon region and the encapsulant;
   a dielectric layer formed over the first die and the encapsulant, the dielectric layer including a dielectric spacer region extending over and laterally across the thermal stress interface; and
   a redistribution layer (RDL) including an RDL element formed over the dielectric spacer region and electrically connected to the conductive contact of the first die through a first opening in the dielectric layer;
   wherein the RDL element is physically spaced apart from the thermal stress interface by the dielectric spacer region.

2. The IC device of claim 1, wherein a coefficient of thermal expansion of the dielectric spacer region ($CTE_{DSR}$) differs from the $CTE_{encapsulant}$ by less than 50% of the $CTE_{encapsulant}$.

3. The IC device of claim 1, wherein a coefficient of thermal expansion of the dielectric spacer region ($CTE_{DSR}$) differs from the $CTE_{encapsulant}$ by less than 25% of the $CTE_{encapsulant}$.

4. The IC device of claim 1, wherein the dielectric spacer region has a coefficient of thermal expansion ($CTE_{DSR}$); and
   wherein a CTE mismatch between the $CTE_{DSR}$ and the $CTE_{encapsulant}$ is less than 50% of a CTE mismatch between the $CTE_{silicon}$ and the $CTE_{encapsulant}$.

5. The IC device of claim 1, wherein the dielectric spacer region has a coefficient of thermal expansion ($CTE_{DSR}$); and
   wherein a CTE mismatch between the $CTE_{DSR}$ and the $CTE_{encapsulant}$ is less than 25% of a CTE mismatch between the $CTE_{silicon}$ and the $CTE_{encapsulant}$.

6. The IC device of claim 1, wherein the dielectric spacer region comprises a polyimide.

7. The IC device of claim 1, comprising a through-mold via laterally spaced apart from the first die;
   wherein the RDL element is electrically connected to the through-mold via through a second opening in the dielectric layer.

8. The IC device of claim 1, comprising a second die mounted to the first die in a face-to-face arrangement.

9. The IC device of claim 8, comprising alignment structures formed over the dielectric layer, the alignment structures comprising a polymer;
   wherein a lateral alignment of the second die is constrained by the alignment structures.

10. The IC device of claim 8, wherein at least a portion of the RDL element is aligned directly between the first die and the second die.

11. A method of forming an integrated circuit (IC) device, the method comprising:

mounting a first die on a substrate, the first die including:

a silicon region having a coefficient of thermal expansion ($CTE_{silicon}$); and a conductive contact on a first side of the first die;

forming an encapsulant on the first die, the encapsulant having a coefficient of thermal expansion ($CTE_{encapsulant}$), wherein a mismatch between the $CTE_{silicon}$ and the $CTE_{encapsulant}$ defines a thermal stress interface between the silicon region and the encapsulant;

forming a dielectric layer over the first die and the encapsulant, the dielectric layer including a dielectric spacer region extending over and laterally across the thermal stress interface; and forming a redistribution layer (RDL) including an RDL element extending over the dielectric spacer region, the RDL element electrically connected to the conductive contact of the first die through a first opening in the dielectric layer;

wherein the RDL element is physically spaced apart from the thermal stress interface by the dielectric spacer region.

12. The method of claim 11, wherein a coefficient of thermal expansion of the dielectric spacer region ($CTE_{DSR}$) differs from the $CTE_{encapsulant}$ by less than 50% of the $CTE_{encapsulant}$.

13. The method of claim 11, wherein the dielectric spacer region has a coefficient of thermal expansion ($CTE_{DSR}$); and wherein a CTE mismatch between the $CTE_{DSR}$ and the $CTE_{encapsulant}$ is less than 50% of a CTE mismatch between the $CTE_{silicon}$ and the $CTE_{encapsulant}$.

14. The method of claim 11, comprising forming a through-mold via extending vertically through the encapsulant and laterally spaced apart from the first die;

wherein the RDL element is electrically connected to the through-mold via through a second opening in the dielectric layer.

15. The method of claim 11, comprising mounting a second die to the first die in a face-to-face arrangement.

16. The method of claim 15, comprising forming alignment structures over the dielectric layer, the alignment structures comprising a polymer; and wherein mounting the second die to the first die in a face-to-face arrangement comprises:

using the alignment structures to laterally align the second die relative to the first die in a face-to-face arrangement, wherein at least one of the second die and the first die is pre-bumped with an array of solder bumps; and performing a reflow process to secure the second die to the first die.

17. An integrated circuit (IC) device, comprising:

a first die including:

an array of first die solder contacts on a first side of the first die; and a plurality of conductive traces on the first side of the first die, wherein the first die has a lateral outer perimeter defining a first die footprint;

a second die mounted to the first die in a face-to-face arrangement with a first side of the second die facing the first side of the first die;

wherein the second die includes an array of second die solder contacts respectively electrically connected to the array of first die solder contacts by respective solder bonds; and wherein the second die has a lateral outer perimeter defining a second die footprint; and a redistribution layer (RDL) including a plurality of RDL elements;

wherein a respective RDL element of the plurality of RDL elements:

(a) is connected to a respective conductive trace of the plurality of conductive traces on the first side of the first die at a location within the lateral outer perimeter of the second die; and (b) extends laterally outside the lateral outer perimeter of the first die and outside the lateral outer perimeter of the second die, so that a portion of the respective RDL element is located between the first die and the second die in a vertical plane.

18. The IC device of claim 17, comprising:

an encapsulant laterally adjacent the first die; and a dielectric layer formed over the first die and the encapsulant, the dielectric layer including a dielectric spacer region extending over and laterally across an interface between the first die and the encapsulant laterally adjacent the first die;

wherein the respective RDL element is formed over the dielectric spacer region and electrically connected to the respective conductive trace on the first side of the first die through a first opening in the dielectric layer; and wherein the respective RDL element is physically spaced apart from the interface between the first die and the encapsulant by the dielectric spacer region.

19. The IC device of claim 17, wherein the first die includes a silicon region having a coefficient of thermal expansion ($CTE_{silicon}$);

the encapsulant laterally adjacent the first die has a coefficient of thermal expansion ($CTE_{encapsulant}$);

wherein the $CTE_{silicon}$ differs from the $CTE_{encapsulant}$ by at least 75% of the $CTE_{encapsulant}$; and wherein a coefficient of thermal expansion of the dielectric spacer region ($CTE_{DSR}$) differs from the $CTE_{encapsulant}$ by less than 50% of the $CTE_{encapsulant}$.

20. The IC device of claim 17, wherein the first die includes a silicon region having a coefficient of thermal expansion ($CTE_{silicon}$);

the encapsulant laterally adjacent the first die has a coefficient of thermal expansion ($CTE_{encapsulant}$);

wherein the dielectric spacer region has a coefficient of thermal expansion ($CTE_{DSR}$); and wherein a CTE mismatch between the $CTE_{DSR}$ and the $CTE_{encapsulant}$ is less than 50% of a CTE mismatch between the $CTE_{silicon}$ and the $CTE_{encapsulant}$.

21. The IC device of claim 17, wherein the second die is spaced apart from the respective RDL element by at least one dielectric cover layer.

* * * * *